United States Patent [19]

Tomono et al.

[11] 4,017,886
[45] Apr. 12, 1977

[54] DISCRETE SEMICONDUCTOR DEVICE HAVING POLYMER RESIN AS INSULATOR AND METHOD FOR MAKING THE SAME

[75] Inventors: Masami Tomono, Kokubunji; Akira Abe, Takasaki; Seiki Harada, Hachioji; Kikuji Sato, Kokubunji; Takeshi Takagi, Takasaki; Genichi Kamoshita, Koganei; Yuichiro Oya, Kodaira; Atsushi Saiki, Musashimurayama, all of Japan

[73] Assignee: Hitachi, Ltd., Japan

[22] Filed: May 16, 1975

[21] Appl. No.: 578,174

Related U.S. Application Data

[63] Continuation-in-part of Ser. No. 407,447, Oct. 18, 1973, abandoned.

[30] Foreign Application Priority Data

Oct. 18, 1972 Japan ............................ 47-103588

[52] U.S. Cl. ............................ 357/54; 260/78 TF; 357/68; 357/71; 357/72
[51] Int. Cl.² ......................................... H01L 23/30
[58] Field of Search ............ 357/54, 72; 260/47 R, 260/78 TF

[56] References Cited

UNITED STATES PATENTS

| 3,323,956 | 6/1967 | Gee ..................................... 357/54 |
| 3,373,323 | 3/1968 | Wolfrum et al. .................... 357/54 |
| 3,405,017 | 10/1968 | Gee ..................................... 357/54 |
| 3,411,122 | 11/1968 | Schiller ............................... 357/72 |
| 3,615,913 | 10/1971 | Shaw .................................. 357/54 |
| 3,697,828 | 10/1972 | Oakes ................................. 357/52 |
| 3,700,497 | 10/1972 | Epifano et al. ..................... 357/72 |
| 3,788,895 | 1/1974 | Schimmer et al. ................. 117/218 |
| 3,801,880 | 4/1974 | Harada et al. ...................... 357/54 |

FOREIGN PATENTS OR APPLICATIONS

| 49-62081 | 6/1974 | Japan |
| 7,314,375 | 4/1974 | Netherlands |

OTHER PUBLICATIONS

Hibberd, Integrated Circuits, (TI Electronics Series, McGraw–Hill, N. Y. 1969), pp. 22–23.
Noll, Chemistry and Technology of Silicones, (Academic Press, N. Y., 1968), pp. 582–584.

Primary Examiner—William D. Larkins
Attorney, Agent, or Firm—Craig & Antonelli

[57] ABSTRACT

Disclosed is a discrete semiconductor device comprising a Si body having an emitter region, a base region and a collector region, an $SiO_2$ layer disposed on the surface of the body, a polyimide resin having a thickness of 5 $\mu$ disposed on the $SiO_2$ layer, electrodes penetrating through the $SiO_2$ layer and the polyimide resin thereby contacting the emitter region and the base region, respectively and extending on the surface of the polyimide resin, whereby it becomes easy to bond a wire connected to an external electrode with the electrodes.

42 Claims, 13 Drawing Figures

DISCRETE SEMICONDUCTOR DEVICE HAVING POLYMER RESIN AS INSULATOR AND METHOD FOR MAKING THE SAME

The present application is a continuation-in-part of application Ser. No. 407,447, filed Oct. 18, 1973 now abandoned.

This invention relates to a discrete semiconductor device, more particularly to an electrode structure of the discrete semiconductor device, and to a method for making the same.

As is well known, a conventional planar type discrete transistor comprises a semiconductor body which acts as a collector; a first semiconductor region, whose conductivity type is opposite to that of the body, disposed in the body, which acts as a base; a second semiconductor region, whose conductivity type is same as that of the body, disposed in the first semiconductor region, which acts as an emitter; an insulating layer disposed on the surface of the body; and electrodes contacting with the first and second regions, through the insulating layer, respectively. In this transistor, as the insulating layer, $SiO_2$ is utilized, and for connecting the electrodes to external terminals, wires are bonded to the electrodes. Usually, since a diameter of the electrode is as small as about 60 $\mu$ to about 100 $\beta$, the bonding of the wires to the electrodes is very difficult, and hence bonding causes obstacles for the mass production of the transistors and for the completely automatic production of the transistors. These obstacles are avoided by providing electrodes having large diameters or by providing electrodes extending on the surface of the $SiO_2$ layer. However, when the electrode having large diameters are provided, the size of the semiconductor body should be large, and hence a cost of the transistor becomes high, and when the electrodes extend on the surface of the $SiO_2$ layer, since the $SiO_2$ layer can not be made in such thickness, there are capacities between the electrodes and the body, and hence not only the characteristic of the transistor degrades, but also it becomes very complicated to design the transistor having a desired characteristic.

As described above, in the conventional discrete transistor, the structure of the electrode causes obstacles for the mass production of the transistors, for the completely automatic production of the transistors, for the cost of the transistors, and for the characteristic of the transistors.

It is, therefore, an object of the present invention to provide a discrete semiconductor device that eliminates the above-mentioned obstacles in the conventional discrete semiconductor device.

It is another object of the present invention to provide a discrete semiconductor device, such as a transistor or a diode which can be made by completely automatic mass production.

The above objects are attained by providing a polymer resin layer on the insulating layer provided on the surface of the semiconductor body.

The additional objects and advantages of this invention will become apparent from the following description when taken in conjunction with the accompanying drawings, wherein:

Figure 1:
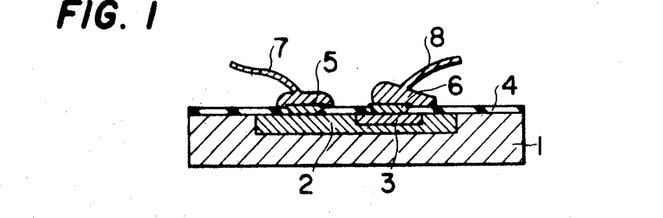
FIG. 1 is a sectional view of a conventional planar type discrete transistor.

Shown in FIG. 1 is a section of one example of a conventional planar type discrete transistor, which comprises a semiconductor body 1 which acts as a collector of the transistor, a first semi-conductor region 2, of a conductivity type that is opposite to that of the body 1, disposed in the body 1, which acts as a base of the transistor, a second semiconductor region 3, of a conductivity that is opposite to that of the first semiconductor region 2, disposed in the first semiconductor region 2, which acts as an emitter of the transistor, an insulating layer 4 disposed on the surface of the semiconductor body 1, having apertures therein for metal electrodes, one of which is a base electrode 5, the other of which is an emitter electrode 6, and wires 7 and 8 which are bonded to the base electrode 5 and the emitter electrode 6, respectively. The wires 7 and 8 are connected to external terminals to which external elements, circuits or electric sources are connected.

As heretofore stated, since a diameter of the electrodes 5 and 6 is usually as small as from about 60 $\mu$ to about 100 $\mu$, the bonding of the wires 7 and 8 to the electrodes 5 and 6 should be done with a remarkable attention. Therefore, it becomes very difficult to mass-produce and to fabricate, in a complete automation, the transistors. This automatic mass production is strongly desired in the industrial areas for the transistors. Though this desire is accomplished by providing electrodes having large diameters or by providing electrodes extending on the surface of the insulating layer 4, the former causes the size of the semiconductor regions 2 and 3, and the semiconductor body 1 to be large, and hence the cost of the transistor becomes high, and the latter causes the capacitance between the electrode and the semiconductor body to be large, and hence the characteristic of the transistor becomes bad. For decreasing the capacitance, though thick insulating films are desired, no significant improvement has been suggested up to now. That is, though, as the insulating layer 4, $SiO_2$ formed by a chemical vapor deposition method or a sputtering method is employed, an upper limit for the thickness of $SiO_2$ is about 1.5 $\mu$ in the chemical vapor deposition method and about 4 $\mu$ in the sputtering method. However, it takes about 7 hours to obtain a $SiO_2$ layer having a thickness of 4 $\mu$ in the sputtering method, since it is required that the growth rate of $SiO_2$ is slower than 6000 A/hour for preventing the generation of cracks by the stress of $SiO_2$ and for preventing the degradation of the characteristic of the semiconductor device. For raising the productivity of such devices, a SiO₂ layer of 1 μ in thickness is usually utilized in the semiconductor devices. Therefore, it is strongly desired in the industrial areas for the transistors to fabricate transistors which has decreased capacitance even under the automatic mass production.

A discrete semiconductor device of the present invention comprises a semiconductor body; a semiconductor region, whose conductivity type is opposite to that of the semiconductor body, disposed in the semiconductor body; an insulating layer disposed on one surface of the semiconductor body; a polymer resin laye disposed on the insulating layer; and an electrode through the insulating layer and the polymer resin layer for contacting with the semiconductor region and extending on at least a part of the surface of the polymer resin layer.

According to the present invention, since the polymer resin layer can be thickened sufficiently and hence the electrode can be extended widely (i.e. to a considered length) on the polymer resin layer, it becomes possible to decrease the capacitance between the electrode and the semiconductor body, and also to bond a wire to the electrode under the automatic mass production.

Further, according to the present invention, when the diameter of the electrode is the same as that of the conventional device, the size of the semiconductor body can be made small rather than that of the conventional semiconductor device.

Furthermore, since, in the present invention, the polymer resin layer is disposed on the surface of the semiconductor body, a surface stabilization of the discrete semiconductor device is increased.

The present invention is explained in detail hereinafter by referring to FIGS. 2 to 6.

Figure 2:
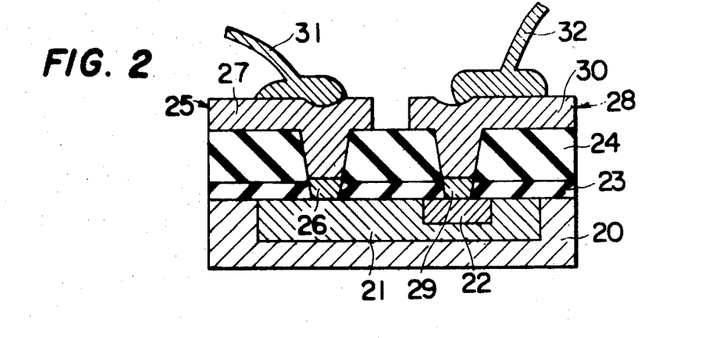
FIG. 2 is a longitudinal sectional view of one embodiment of the present invention.

Shown in FIG. 2 is a section of a planar-type transistor which is one embodiment of the present invention.

In FIG. 2, reference numeral 20 designates an n-type Si body which acts as a collector of the transistor, in which a first semiconductor region 21 of p-type is disposed, which acts as a base of the transistor. Reference numeral 22 designates a second semiconductor region of n-type disposed in the first semiconductor region 21, which acts as an emitter of the transistor and reference numeral 23 designates an SiO₂ layer disposed on the surface of the Si body 20, on which a polymer resin layer 24 having a thickness of 5 μ is disposed. A base electrode 25 penetrates the polymer resin layer 24 and the SiO₂ layer 23 to contact with the first semiconductor region 21. This electrode consists of a first metal layer 26 and a second metal layer 27 which extends to a part of the surface of the polymer resin layer 26. Reference numeral 28 designates an emitter electrode penetrating the polymer resin layer 24 and the SiO₂ layer 23 to contact with the second semiconductor region 22. The emitter electrode consists of a third metal layer 29 and a fourth metal layer 30 which extends to another part of the surface of the polymer resin layer 26 than the part at which the second metal layer 27 is disposed. Wires 31 and 32 are bonded to the second metal layer 27 and the fourth metal layer 30, respectively.

Figure 2A:
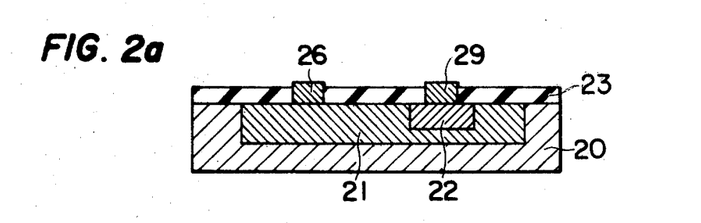
FIGS. 2a and 2b show in longitudinal section, explanatory views of the intermediate products obtained in the process for making the embodiment shown in FIG. 2.
Figure 2B:
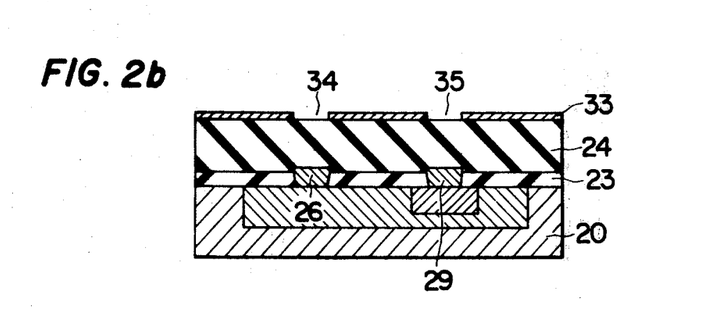

This transistor is fabricated by preparing the semiconductor Si body 20 of n-type, diffusing boron into the body 20 for forming the first region 21, which acts as the base, diffusing phosphorus into the first semiconductor region 21 for forming the second semiconductor region 22, which acts as the emitter, forming the SiO₂ layer 23 on the surface of the body 20, forming apertures in the SiO₂ layer 23 for exposing the surfaces of a part of the first semiconductor region 21 and a part of the second semiconductor region 22, forming the first metal layer 26 of Al and the third metal layer 29 of Al in the apertures, (FIG. 2a), forming the polymer resin layer 24 having a thickness of 5 μ on the surfaces of the SiO₂ layer 23 and of the first and third metal layers 26 and 29, forming a metal layer 33 having apertures 34 and 35 at corresponding parts to the first and third metal layers 26 and 29 (FIG. 2b), etching selectively the polymer resin layer 24 through the apertures 34 and 35 for exposing the surfaces of the first and third metal layers 26 and 29, removing the metal layer 33, forming the second metal layer 27 and the fourth metal layer 30 so that one part thereof is connected to each of the first and third metal layers 26 and 29 and other part thereof extends on the surface of the polymer resin layer 24, and metallically bonding wires 31 and 32 to the second metal layer 27 and the fourth metal layer 30.

As a polymer resin for the polymer resin layer 24, any polymer resin, such as a thermoplastic polymer resin, for example, Teflon and a copolymer of fluorinated ethylene/propylene, and a thermosetting polymer resin, for example, resins of polyimide, epoxy, phenol, polycarbonate, polyamide, and polybenzimidazole types can be utilized. However, the thermosetting polymer resin is more preferable for the present invention than the thermoplastic polymer resin, since, when the thermosetting polymer resin is utilized as the polymer resin of the polymer resin layer 24, the bonding temperature for bonding the wires 31 and 32 to the second and fourth metal layers 27 and 30 becomes higher, as compared with the bonding temperature when the thermoplastic polymer resin is utilized as the polymer resin of the polymer resin layer 24. This results since the softening temperature of the thermosetting polymer resin is higher than that of the thermoplastic polymer resin. Notwithstanding that a short time period for a bonding time and a higher temperature than 300° C. for a bonding temperature are desired for the automatic wire bonding, a softening temperature of the Teflon or a similar thermoplastic polymer resin is about 200 – 250 °C., and hence the wires should be bonded to metal layers in a long time period within the softening temperature.

Further, when Teflon is utilized as the polymer resin of the polymer resin layer 24, it must be applied in the form of fine powder or thin film over the SiO₂ layer disposed on the semiconductor body and must be pressed against the latter with heat and under a considerable pressure.

For the above-mentioned reasons, the thermosetting polymer resin is more preferable for the present invention than the thermoplastic polymer resin.

In the above embodiment, the polyimide resin is utilized as the polymer resin layer 24, and the polymer resin layer 24 is formed as follows.

A polyimide solution having the following composition is prepared;

| Nonvolatile contents: | |
|---|---|
| 4,4'-Diaminodiphenylether-3-Carbonamide | 5 mol % |
| 4,4'-Diaminodiphenylether | 45 mol % |
| Pyromellitic acid dianhydride | 25 mol % |

| | |
|---|---|
| 3,3',4,4'-Benzophenontetracarboxylic acid dianhydride | 25 mol % |
| Solvent contents: | |
| N-Methyl-2-Pyrrolidone | 50 Wt.% |
| N,N-Dimethylacetoamide | 50 Wt.% |
| Nonvolatile concentration | 20 Wt.% |
| Viscosity of the Solution | about 300 centipoises |

The prepolymer solution of polyimide is applied onto the surfaces of the $SiO_2$ layer 23 and of the first and the third metal layers by a rotor running at about 5000 rpm, whereby a polymer resin layer having a thickness of about 1 $\mu$ is formed. For forming the polymer resin layer having a desired thickness, the viscosity of the solution, the concentration of the nonvolatile contents, and/or the rotating speed of the rotor are controlled or the solution is applied on the formed polymer resin laye by means of lap applications. By means as described above, the thickness of the polymer resin layer is controlled so as to have from less than 1 $\mu$ to more than 10 $\mu$ at will. In this embodiment, the polymer resin layer having a thickness of 5 $\mu$ is formed.

To contact the third metal layer 27 with the first metal layer 26 and the fourth metal layer 30 with the second metal layer 29, through holes are formed in the polymer resin layer 24 by forming metal layer 33 on the surface of the polymer resin layer 24 having apertures 34 and 35 at corresponding portions to the first and third metal layers 26 and 29, and etching the polymer resin layer disposed under the apertues 34 and 35 by an oxygen plasma. For etching away the polyimide resin layer of 5 $\mu$ in thickness, the plasma etching is carried out for 10 minutes under the plasma whose output is 0.7 KW generated under oxygen having an 0.6 Torr pressure and a flow rate of 3 liters per minute. A time period of the etching is controlled by selecting the flow rate of the oxygen, the pressure of the oxygen, and/or the high frequency of power applied to the oxygen.

It is preferable that the metal layer 33 for preventing the etching of the polymer resin layer 24 is a layer which is thinner than the thickness of each of the first and third metal layers 26 and 29 or is a material which is etched by a solution other than that used for etching the first and third metal layers 26 and 29. In this embodiment, the first and third metal layers 26 nd 29 are made of Al having a thickness of 1 $\mu$, and the metal layer 33 is made of Al having a thickness of 0.4 $\mu$, whereby upon removing the metal layer 33 the first and third layers 26 and 29 remaining have enough thicknesses.

The second and fourth metal layers 27 and 28 are of Al and are formed by evaporating Al in the through holes and the surface of the polymer resin layer 24 and etching the evaporated Al in a predetermined pattern. It, however, occasionally happens that Al is not evaporated on the side walls of the through holes. For preventing this, it is preferable to rotate the semiconductor body 20 during the evaporation of Al.

In the above-mentioned embodiment, a polymer resin having a following formula is utilized:

wherein a + b = 5 mole %
c + d = 45 mole %
a + c = 25 mole %
b + d = 25 mole %

Figure 3:
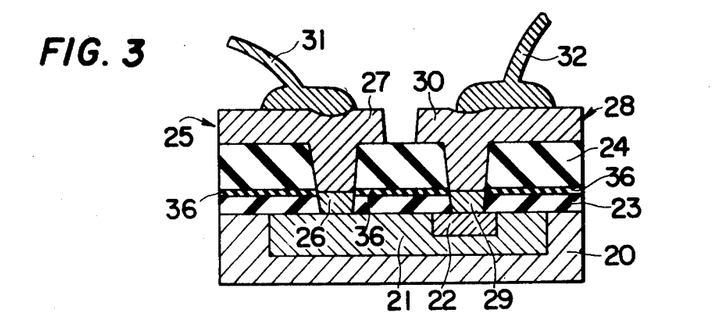
FIG. 3 is a longitudinal sectional view of another embodiment of the present invention.

Shown in FIG. 3 is a section of another embodiment of the present invention, which provides a stronger adhesiveness between the $SiO_2$ layer and the polymer resin layer than that in the embodiment shown in FIG. 2. In FIG. 3, the same reference numerals used in FIG. 2 show the same parts as in FIG. 2.

In FIG. 3, a layer 36 of organic compound is disposed between $SiO_2$ layer 23 and the polymer resin layer 24. This organic compound contains both an alkoxysilane group prone to forming a chemical bond with an inorganic material and an amino or epoxy group prone to forming a chemical bond with the polymer resin layer, thereby bonding the polymer resin layer 24 and the $SiO_2$ layer 23 through secure chemical bonds.

The layer 36 of the amino-silance compound can be formed in the following manner. The semiconductor body 20 on which $SiO_2$ layer 23 is disposed is immersed in an isopropyl alcohol solution which contains 1 weight % of N-β (aminoethyl)-γ-aminopropyl methyl dimethoxy silane. Thus, the surface of the SiO$_2$ layer is caused to adsorb the amino-silane compound.

The layer 36 of the amino-silane compound for coupling the SiO$_2$ layer and the polyimide resin layer can be formed by utilizing the amino-silane coupling agent of "KBM 602" (trade name, produced by Shin-etsu Chemical Industry Corp., a manufacturer in Japan). The amino-silane coupling agent is dissolved in an appropriate solvent such as water, ketone, ether and alcohol, to prepare a solution at an appropriate solution of, for example, 0.05 – 20 weight %. Thereafter, the semiconductor body with SiO$_2$ layer thereon is immersed in the solution, or the solution is applied on the surface of SiO$_2$ layer. Then the semiconductor body is dried at about 100° C. for about 30 minutes.

After the formation of the amino-silance compound on the SiO$_2$ layer, the polymer resin layer 24, the second and fourth metal layers, and wires are formed according to the procedures used for the embodiment shown in FIG. 2.

Figure 4:
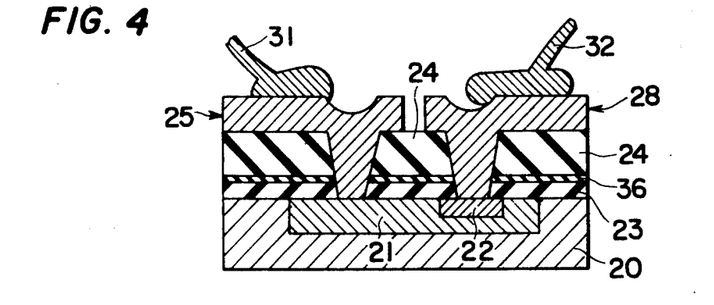
FIG. 4 is a longitudinal sectional view of a further embodiment of the present invention.

A further embodiment of the present invention is shown in FIG. 4 wherein the same parts as in FIG. 3 are shown by the same reference numerals as in FIG. 3.

In this embodiment only one metal layer is utilized as the base electrode 25 or as the emitter electrode 28.

This transistor is formed in the manner described below.

Figure 4A:
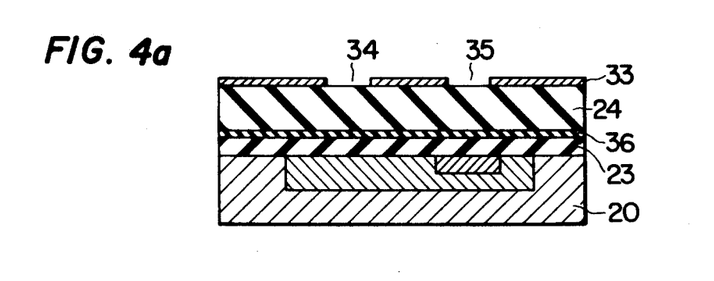
FIGS. 4a and 4b show in longitudinal section, explanatory views of intermediate products obtained in the process for making the further embodiment shown in FIG. 4.
Figure 4B:
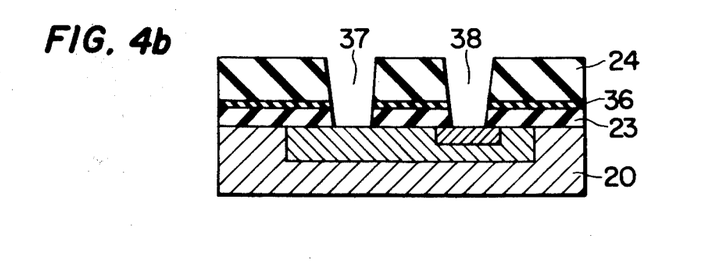

On the surface of the semiconductor body 20 wherein the collector 20, the base 21 and the emitter 22 of the transistor are disposed, the SiO$_2$ layer 23 is formed by a conventional method, such as a thermal oxidization method and a chemical vapor deposition method. A layer 36 of an amino-silane compound is then formed using N-β(aminoethyl) - γ -aminopropyl methyl dimethoxy silance as heretofore described. Thereafter, a polyimide resin layer 24 is formed on the amino-silane compound layer 36 in the following way. A prepolymer solution of a polyimide resin is applied on the amino-silane compound layer 36, dried at 100° C., and heated at 300° C. for one hour, to be hardened. The polyimide resin layer 24 is formed so as to have a thickness of 8 μ. A metal layer 33 of Al having apertures 34 and 35 at portions corresponding to selected portions of the base region 21 and the emitter region 22 is formed on the polyimide resin layer 24 (FIG. 4a). The polyimide resin layer 24 and the amino-silane compound layer 36 under the apertures 34 and 35 are selectively etched by means of a plasma, and the SiO$_2$ layer corresponding to the apertures 34 and 35 is etched by a well known etching solution, such as a mixed solution of a fluoric acid and an ammonium fluoride, thereby forming through holes 37 and 38 reaching to the selected portions of the base region 21 and the emitter region 22, respectively. After the metal layer 33 is etched away (FIG. 4b), a base electrode 25 and an emitter electrode 28 of Al are formed by sputtering Al and etching the sputtered Al so as to have a predetermined pattern. And then, wires 31 and 32 are bonded to the base electrode 25 and the emitter electrode 28, respectively, by means of a thermal compression bonding or an ultrasonic bonding.

Since the electrodes 25 and 28 are formed in one step, the process for forming the transistor shown in FIG. 4 becomes simpler than that for forming the transistor shown in FIG. 3.

Figure 5:
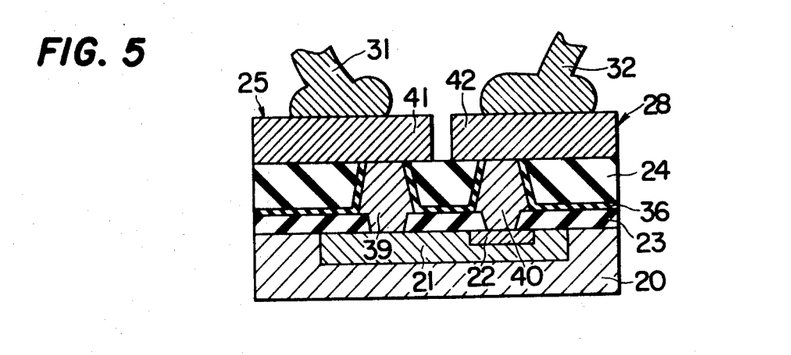
FIG. 5 is a longitudinal sectional view of a still further embodiment of the present invention.

Still further embodiment of the present invention is shown in FIG. 5 wherein the same parts as in FIG. 4 are shown by the same reference numerals as in FIG. 4.

In this embodiment, the base electrode 25 consists of a first trapezoidal metallic land 39 and a first metal plate 41, the emitter electrode 28 consists of a second trapezoidal metallic land 40 and a second metal plate 42, and an organic compound layer 36 is also disposed between the first and second trapezoidal metallic lands 39 and 40 and the polymer resin layer 24.

Since the wires 31 and 32 are bonded to the first and second metal plates 41 and 42, respectively, that is, the wires are bonded on the plane surface, the wires are firmly connected with the metal plates.

This transistor is formed in the following manner.

Figure 5A:
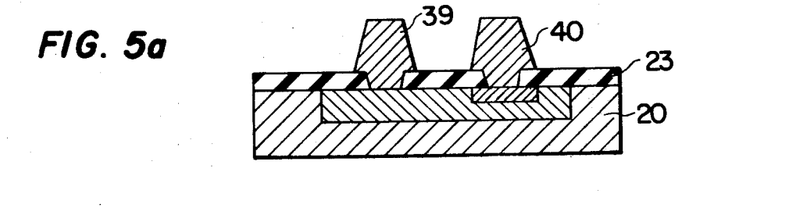
FIGS. 5a to 5c show in longitudinal section, explanatory views of intermediate products obtained in the process for making the still further embodiment shown in FIG. 5.
Figure 5B:
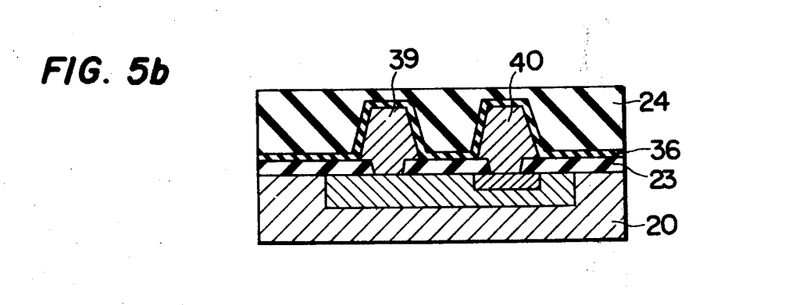
Figure 5C:
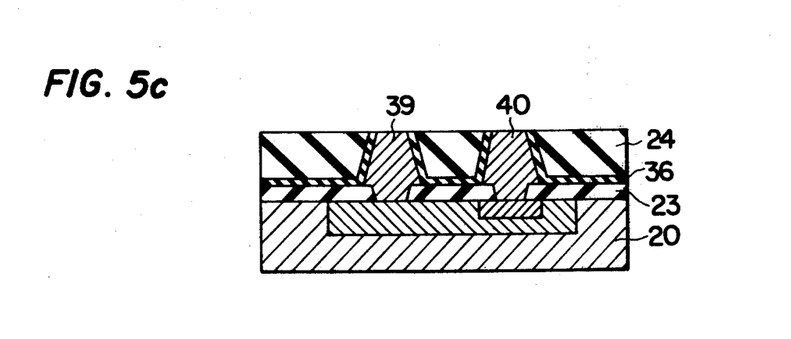

On the semiconductor body 20 in which the transistor elements of the collector 20, the base 21 and the emitter 22 are disposed, as shown in FIG. 5a, the insulating layer 23 of SiO$_2$ is formed by the chemical vapor deposition method or the thermal oxidization method, and then through holes are provided in the SiO$_2$ layer 23 at portions corresponding to parts of the base and emitter regions 21 and 22. Al layer having a thickness of 5 μ is formed by depositing Al on the SiO$_2$ layer 23 and the exposed surfaces of the base and emitter regions 21 and 22, and the deposited Al layer excepting those deposited on the exposed surfaces of the base and emitter regions 21 and 22 is etched, whereby a first trapezoidal metallic land 39 and a second trapezoidal metallic land 40 are formed as shown in FIG. 5a. The layer 36 of the organic compound of the amino-silane is formed on the surfaces of the SiO$_2$ layer 23 and of the first and second tapezoidal metallic lands 39 and 40 using N-β(aminoethyl)-γ-aminopropyl methyl dimethoxy silane. On the amino-silane layer 36, the layer 24 of the polymer resin of the polyimide resin having a thickness of 6 μ is formed during a rotation of the resultant semiconductor body. (FIG. 5b). Then, the polyimide resin layer 24 and the amino-silane layer 36 formed on the surfaces of the first and second trapezoidal metallic lands 39 and 40 are uniformly etched by the oxygen plasma as hereinbefore described so as to expose the top surfaces of the trapezoidal metallic lands 39 and 40. (FIG. 5c). On the etched surface of the polyimide resin layer 24 and on the exposed surfaces of the trapezoidal metallic lands 39 and 40, an Al layer is formed by depositing Al, and the Al layer is etched by well known etching techniques so as to make the first metal plate 41 and the second metal plate 42. And then, to the metal plates 41 and 42, wires 31 and 32 are bonded, whereby the transistor shown in FIG. 4 is completely performed.

It is preferable, in this embodiment, that the polymer resin layer 24 is formed so that the thickness of the polymer resin layer is thicker than that of the trapezoidal metallic lands 30 and 40, for easily forming plane surfaces of the metallic plates 41 and 42.

Although in the embodiments described above, a polyimide resin is utilized as the material for the polymer resin layer, it should be noted that, as described before, any number of suitable polymer resins may be utilized as a material of the polymer resin layer.

Moreover, although the polymer resin layer of the foregoing embodiments is made from a polyimide having the formula:

wherein  a + b = 5 mole %
c + d = 45 mole %
a + c = 25 mole %
b + d = 25 mole % polyimide resins having the following general formulae may be utilized and

-continued wherein $Ar_1$, $Ar_2$, $Ar_3$ and $Ar_4$ are selected from aromatic multivalent groups and $m$ and $n$ are positive integers. In the foregoing formulas, it is preferable that $Ar_1$ and $Ar_3$ are groups having aromatic rings selected from the following formulae:

and $Ar_2$ and $Ar_4$ are groups having aromatic rings selected from following formulae;

(a) Benzene ring
(b) Diphenylether ring
(c) Benzophenon ring.

It is most preferable that $Ar_1$ is a divalent group of the diphenylether ring and $Ar_2$ is a tetravalent group of the benzene ring in the formula (1), and $Ar_1$ is a divalent group of the diphenylether ring, $Ar_2$ is a tetravalent group of the benzene ring, $Ar_3$ is a trivalent group of the diphenylether ring and $Ar_4$ is a tetravalent group of the benzophenon ring in formula (2).

It will be appreciated that in the reactions involved in the formation of the polymers identified by formula (2) above, more than one tetracarboxylic acid dianhydride may be used to form a particular polymer. Since each tetracarboxylic acid dianhydride will react both with the diamino compound and with the diaminoamide compound, the final polymer product may have a plurality of like or unlike segments in sequence. Thus, in one segment of the polymer $Ar_2$ may be and $Ar_4$ may be while in another segment of the polymer $Ar_2$ may be and $Ar_4$ may be

The preparation of polyimides of formula (2) above is disclosed in Japanese Pat. No. 702,696 (Japanese Pat. No. 48-2956), the disclosure of which is incorporated herein by reference. As generally described in that patent modified polyimides having within each molecule thereof one or more moieties having the formula wherein Ar is a trivalent aromatic radical, are obtained by reacting together (1) an aromatic diaminoamide compound in which the amide moiety is in an ortho position with respect to one of the amino moieties, (2) an aromatic diamine, and (3) one or more aromaic tetracarboxylic acid dianhydrides. When polymers of this type are utilized in accordance with the present invention to form polymer resin layer 24, the ratio of the aromatic diaminoamide to the aromatic diamine can vary between preferably 1/9 to 5/1. The sulfur based polyimides described in Japanese Pat. No. 702,696 in which the —CO— group is replaced by —SO$_2$— can also be used to form polymer resin layer 24, the ratio of the diaminoamide to diamine being preferably 1/9 to 5/1. Thus, in accordance with the one embodiment of the present invention, polymer resin layer 24 is made from a modified polyimide resin including groups having the formula wherein Ar is a trivalent aromatic radical and Y is —CO— or —SO$_2$—, and more specifically from modified polyimide resins having the formula wherein Ar$_1$ is a divalent aromatic radical, Ar$_2$ is a tetravalent aromatic radical, Ar$_3$ is a trivalent aromatic radical, Ar$_4$ is a tetravalent aromatic radical, Y is —CO— or —SO$_2$—, and m and n ar positive integers.

The modified polyimide resins of formula (2) above as well as those in which the —CO— group is replaced by —SO$_2$— exhibit high thermal stabilities as well as excellent electrical insulation properties (e.g. high dielectric breakdown strengths). In addition, these modified polyimides further possess excellent abrasion resistance and good resistance to chemicals. Accordingly, these polyimides can be used to significant advantage in accordance with the present invention to form semiconductor devices having superior operating properties by manufacturing techniques involving comparatively high temperature operations.

Polyimide resin layer 24 has been etched utilizing physical techniques, such as oxygen plasma, in the embodiments described above, but chemical techniques also may be employed for etching the polyimide resin layer. That is, for example, when the polyimide solution is applied onto the SiO$_2$ layer of the organic compound layer and heated at 160° C. for 1 hour, the solvent in the polyimide solution is evaporated, and hence the polyimide becomes in a semi-cured state. At this stage, portions of the polyimide in the semi-cured state to be removed are contacted with aqueous solution of hydrazine of 40 to 80% concentration, thereby removing the polyimide in the semi-cured state easily. And then, when heat treatments of 200° C. for 1 hour, and successively 300° C. for 1 hour are carried out, the polyimide becomes in a polymer state, whereby a stable polyimide resin layer utilizable for the present invention is formed. That is, the present invention can also be achieved by utilizing chemical techniques for etching the polyimide resin layer.

It should also be appreciated that the metal useful for the electrodes is not limited to Al mentioned in the embodiments, but other metals, such as Ti, Mo, Au, Ag, Cu, Cr, Pt, combinations thereof, and alloys thereof may be emloyed.

Further, though, in the embodiments mentioned above, the polymer resin layer having a thickness of 5 $\mu$ or 8 $\mu$ is utilized, the thickness of the polymer resin layer is not limited to such values, but to about 2 to about 15 $\mu$. For maintaining a mechanical strength of the polymer resin layer at when the wires are bonded to the electrodes, a thickness of 2 $\mu$ of the polymer resin layer is necessary and for forming through holes for the electrodes easily a thickness of 15 $\mu$ of the polymer resin layer is preferable. According to the experiments of the present inventors, more preferable thickness of the polymer resin layer is about 3 to about 10 $\mu$, which is apparent from FIG. 6.

Figure 6:
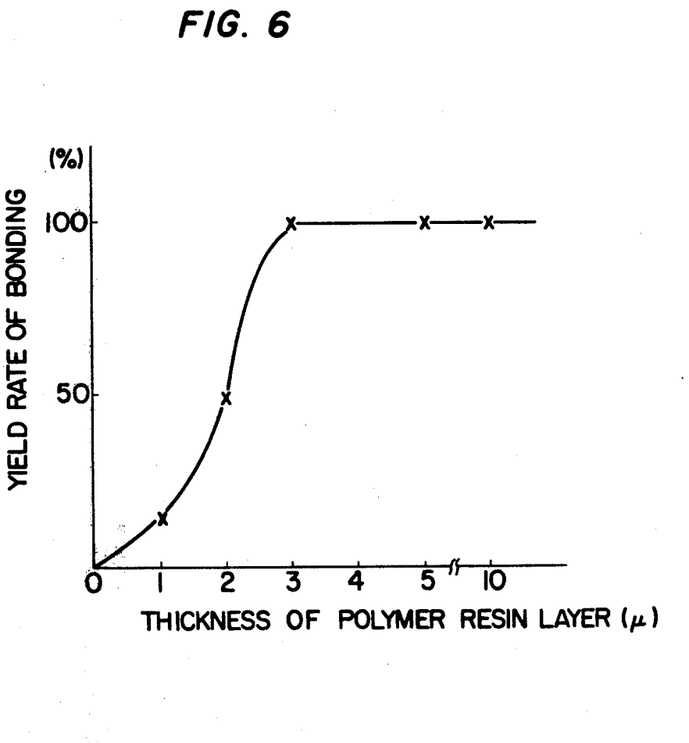
FIG. 6 is a graph showing a relationship between a thickness of a thermo-setting polymer resin and a yield rate of bonding.

FIG. 6 shows a relationship between the thickness of the polymer resin layer and a yield rate of the bonding. As is apparent from FIG. 6, when the thickness of the polymer resin layer is about 2 $\mu$, the yield rate of the bonding becomes about 50%, and when the thickness of the polymer resin layer is about 3 $\mu$, the yield rate of the bonding becomes about 100%. This increase of the yield rate of the bonding is very important effect for the present invention, as well as the effect of the completely automatic mass production of the discrete semiconductor devices, such as transistors and diodes.

Further, though in the embodiments, the aminosilane compound which is effective to increase the adhesiveness between the polyimide resin layer and the SiO$_2$ layer is employed, for the increase of the adhesiveness between the polymer resin of the epoxy type and the SiO$_2$ layer, an epoxy silane compound, such as $\beta$-(3,4 Epoxycyclhexyl) ethyl trimethoxy silane and $\gamma$-Glycidoxy propyl trimethoxy silane may be utilized.

It will be appreciated that the alkoxysilane group of the compound used to improve the adhesiveness between the polymer resin layer and the inorganic insulating layer, e.g. silicon dioxide, contains from 1 to 3 carbon atoms and that the epoxy group of this compound is a 3-membered ring containing two carbon atoms.

Moreover, it will be appreciated that among the polymer resins useful for this invention are the epoxy resins such as Epikoat 1008 sold by Shell Oil Company; the phenolic resins such as EKR 2620 sold by Union Carbide Company, the polycarbonates formed by synthesizing bisphenol A and carbonyl chloride; the polyamides such as HI 480 sold by Hitachi, Kasei Kogyo Kabushiki-Kaisha and the polybenzamidzole resins such as that formed by synthesizing isoterephthalic acid and di-aminobenzidine.

It will also be appreciated from the above examples that the time required for forming the polymer resin layer to the thickness sufficient for the purposes of the subject invention is considerably less than that requied for forming inorganic insulating layers such as those of SiO$_2$. Generally, the polymer resin layer can be applied, e.g. coated, and cured within a period of two hours or less.

Concerning the thickness of the organic compound layer, it will be understood that this layer is usually very thin and is a monolayer having a thickness on the order of about 10 A or less.

Also, the thickness of the electrode layer on the surface of the polymer resin layer may vary from about 1 to 10 microns.

As heretofore noted the wires are metallically bonded in the metal electrode layers by conventional procedures, for example, gold or aluminum may be used.

Although the novel principles of the invention have been described above, it will be understood that various omissions, modifications and changes in these principles may be made by one skilled in the art without departing from the spirit and scope of the invention.

What is claimed is:

1. A semiconductor device comprising:
   a semiconductor body including a semiconductor region of a conductivity type opposite to that of the body;
   an insulating layer disposed on a surface of the semiconductor body;
   a polymer resin layer on said insulating layer, said polymer comprising a modified polyimide that is the reaction product of about 5 mol %, 4,4'-diaminodiphenylether-3-carbonamide; about 45 mol % 4,4'-diaminodiphenylether; about 25 mol % pyromellitic acid dianhydride; and about 25 mol % 3,3',4,4'-benzophenontetracarboxylic acid dianhydride;
   an electrode reaching into a part of the semiconductor region, said electrode penetrating the polymer resin layer and the insulating layer and extending on the surface of the polymer resin layer; and
   a wire bonded to said electrode.

2. A semiconductor device according to claim 1, which further comprises means in the form of an organic compound layer disposed between the insulating layer and the polymer resin layer for improving the adhesiveness between the insulating layer and the polymer resin layer.

3. A semiconductor device according to claim 2, which further comprises an organic compound layer disposed between the polymer resin layer and the electrode.

4. A semiconductor device according to claim 2, wherein the organic compound is of an amino-silane compound.

5. A semiconductor device according to claim 3, wherein the organic compound is a compound which contains an alkoxysilane and an amino group.

6. A semiconductor device according to claim 1, wherein said electrode consists of mesa-shaped metallic land having a top surface that is coplanar with the surface of the polymer resin layer and that penetrates the polymer resin layer and the insulating layer, and a metal plate disposed on the top surface of the mesa-shaped metallic land and the surface of the polymer resin layer.

7. A semiconductor device according to claim 1, wherein the thickness of the polymer resin layer is from about 2μ to about 15μ.

8. A semiconductor device according to claim 1, wherein the thickness of the polymer resin layer is from about 3μ to about 10μ.

9. A semiconductor device according to claim 1, wherein the polymer resin layer is thicker than said insulating layer.

10. A transistor comprising:
    a semiconductor body having a first semiconductor region of a conductivity type opposite to that of the semiconductor body disposed in the semiconductor body and a second semiconductor region of a conductivity type opposite to that of the first semiconductor region disposed in the first semiconductor region;
    an insulating layer disposed on the surface of the semiconductor body;
    a polymer resin layer on said insulting layer comprising a modified polyimide resin, said modified polyimide being the reaction product of about 5 mol % 4,4'-diaminodiphenylether-3-carbonamide; about 45 mol % 4,4'-diaminodiphenylether; about 25 mol % pyromellitic acid dianhydride; and about 25 mol % 3,3',4,4'-benzophenontetracarboxylic acid dianhydride;
    a base electrode disposed in contact with a part of the first semiconductor region, said base electrode penetrating the polymer resin layer and the insulating layer and extending on a part of a surface of the polymer resin layer;
    an emitter electrode disposed in contact with a part of the second semiconductor region, said emitter electrode penetrating the polymer resin layer and the insulating layer and extending on a different part of the surface of the polymer resin layer from the part on which the base electrode is exposed; and
    wires bonded to the emitter electrode and the base electrode, respectively.

11. A transistor according to claim 10, which further comprises an organic compound layer disposed between the insulating layer and the polymer resin layer.

12. A transistor according to claim 11, which further comprises an organic compound layer disposed between the polymer resin layer and the emitter and the base electrodes.

13. A transistor according to claim 11, wherein the organic compound is a compound which contains an alkoxysilane group and an amino group.

14. A transistor according to claim 10, which further comprises means in the form of an organic compound layer disposed between the insulating layer and the polymer resin layer for improving the adhesiveness between the insulating layer and the polymer resin layer.

15. A transistor according to claim 14, wherein the organic compound is of an amino-silane compound.

16. A transistor according to claim 14, wherein the organic compound is a compound which contains an alkoxysilane and an amino group.

17. A transistor according to claim 10, wherein each of said base and emitter electrodes consists of mesa-shaped metallic land having a top surface that is coplanar with the surface of the polymer resin layer and that penetrates the polymer resin layer and the insulating layer, and a metal plate disposed on the top surface of the mesa-shaped metallic land and the surface of the polymer resin layer.

18. A transistor according to claim 10, wherein the thickness of the polymer resin layer is from about 2μ to about 15μ.

19. A transistor according to claim 18, wherein the thickness of the polymer resin layer is from about $3\mu$ to about $10\mu$.

20. A transistor according to claim 10, wherein the polymer resin layer is thicker than said insulating layer.

21. A transistor according to claim 10, wherein said insulating layer is made from silicon dioxide.

22. The device according to claim 1, wherein said insulating layer is silicon dioxide.

23. The transistor of claim 10, wherein said insulating layer is silicon dioxide.

24. A semiconductor device comprising:
a semiconductor body including therein a semiconductor region having an opposite conductivity type to that of the body; and
insulating material disposed on a surface of the body, said insulating material including a polymer resin layer of a modified polyimide that is the reaction product of about 5 mol % 4,4'-diaminodiphenylether-3-carbonamide; about 45 mol % 4,4'-diaminodiphenylether; and about 50 mol % of an aromatic tetracarboxylic acid dianhydride.

25. A semiconductor device according to claim 24, wherein the thickness of the polymer resin layer is from about $2\mu$ to about $15\mu$.

26. A semiconductor device according to claim 25, wherein the thickness of the polymer resin layer is from about $3\mu$ to about $10\mu$.

27. A semiconductor device according to claim 24, wherein said 50 mol % of an aromatic tetracarboxylic acid dianhydride consists of about 25 mol % pyromellitic acid dianhydride, and about 25 mol % 3,3',4,4'-benzophenontetracarboxylic acid dianhydride.

28. A semiconductor device according to claim 24, wherein said insulating material also includes an insulating layer disposed on the surface of said semiconductor body.

29. A semiconductor device according to claim 28, wherein the polymer resin layer is thicker than said insulating layer.

30. A semiconductor device according to claim 28, which further comprises means in the form of an organic compound layer disposed between the insulating layer and the polymer resin layer for improving the adhesiveness between the insulating layer and the polymer resin layer.

31. A semiconductor device according to claim 30, wherein the organic compound is of an amino-silane compound.

32. A semiconductor device according to claim 30, wherein the organic compound is a compound which contains an alkoxysilane and an amino group.

33. A semiconductor device according to claim 24, wherein the thickness of the polymer resin layer is from about $2\mu$ to about $15\mu$.

34. A semiconductor device according to claim 24, wherein the thickness of the polymer resin layer is from about $3\mu$ to about $10\mu$.

35. A semiconductor device according to claim 24, wherein the polymer resin layer is thicker than said insulating layer.

36. A semiconductor device according to claim 24, wherein said insulating layer is made from silicon dioxide.

37. A method for making a discrete semiconductor device comprising:
preparing a semiconductor body including a semiconductor region having a conductivity type opposite to that of the body;
forming an insulating layer on the surface of the semiconductor body;
forming on the surface of the insulating layer a polymer resin comprising a polymer resin which is the reaction product of about 5 mol % 4,4'-diaminodiphenylether-3-carbonamide; about 45 mol % 4,4'-diaminodiphenylether; and about 50 mol % of an aromatic tetracarboxylic acid dianhydride.

38. The method of claim 37, further comprising forming an organic compound layer on the insulating layer to enhance the adhesiveness of the resin layer to the insulating layer.

39. The method of claim 37, wherein said 50 mol % of an aromatic tetracarboxylic acid dianhydride comprises about 25 mol % pyromellitic acid dianhydride; and about 25 mol % 3,3', 4,4'-benzophenontetracarboxylic acid dianhydride.

40. A method for making a transistor comprising:
preparing a semiconductor body having a first semiconductor region having a conductivity type opposite to that of the semiconductor body, said first semiconductor region being formed in the semiconductor body, and a second semiconductor region having a conductivity type opposite to that of the first semiconductor region, said second semiconductor region being formed in said first semiconductor region;
forming an insulating layer on a surface of the semiconductor body;
applying on the surface of the insulating layer while rotating the resultant semiconductor body a polyimide solution of a polymer resin which is the reaction product of about 5 mol % 4,4'-diaminodiphenylether-3-carbonamide; about 45 mol % 4,4'-diaminodiphenylether; and about 50 mol % of an aromatic tetracarboxylic acid dianhydride;

heating the applied polyimide solution for forming a polyimide resin layer;

etching the polyimide resin layer and the insulating layer for exposing a part of the first semiconductor region and the part of the second semiconductor region;

forming a first metal layer so as to reach to a part of the first semiconductor region and to extend on a part of the surface of the polyimide resin layer;

forming a second metal layer so as to reach to a part of the second semiconductor region and to extend to a part of the surface of the polyimide resin layer other than the part on which the first metal layer is formed; and bonding wires to the first and the second metal layers.

41. The method of claim 40, further comprising forming an organic compound layer on the insulating layer to enhance the adhesiveness of the resin layer to the insulating layer.

42. The method of claim 40, wherein said 50 mol % of an aromatic tetracarboxylic acid dianhydride comprises about 25 mol % pyromellitic acid dianhydride; and about 25 mol % 3,3', 4,4'-benzophenontetracarboxylic acid dianhydride.

* * * * *